US012726168B2

(12) United States Patent
Abbott et al.

(10) Patent No.: US 12,726,168 B2
(45) Date of Patent: Sep. 1, 2026

(54) ACOUSTIC WAVE DEVICE WITH MULTI-LAYER PIEZOELECTRIC SUBSTRATE

(71) Applicant: Skyworks Solutions, Inc., Irvine, CA (US)

(72) Inventors: Benjamin Paul Abbott, Irvine, CA (US); Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 43 days.

(21) Appl. No.: 18/655,877

(22) Filed: May 6, 2024

(65) Prior Publication Data

US 2024/0364290 A1 Oct. 31, 2024

Related U.S. Application Data

(63) Continuation of application No. 17/119,904, filed on Dec. 11, 2020, now Pat. No. 12,009,795, which is a (Continued)

(51) Int. Cl.
*H03H 3/08* (2006.01)
*H03H 3/04* (2006.01)
(Continued)

(52) U.S. Cl.
CPC .............. *H03H 3/08* (2013.01); *H10N 30/40* (2023.02); *H03H 2003/0435* (2013.01); *H10N 30/50* (2023.02)

(58) Field of Classification Search
CPC ............. H03H 3/08; H03H 2003/0435; H03H 9/02551; H03H 9/02559; H03H 9/02834;
(Continued)

(56) References Cited

U.S. PATENT DOCUMENTS 4,037,176 A 7/1977 Ono et al.
5,446,329 A 8/1995 Nakahata et al.
(Continued)

FOREIGN PATENT DOCUMENTS

JP 2004343359 A * 12/2004 ......... H03H 9/02574

OTHER PUBLICATIONS

Inoue et al., "Spurious Free SAW Resonators on Layered Substrate with Ultra-High Q, High Coupling and Small TCF", Acoustic Technology R&D, Qorvo, Inc., 4 pgs. (Accessed on Sep. 5, 2019).
(Continued)

*Primary Examiner* — Thomas J Hong
*Assistant Examiner* — Jose K Abraham
(74) *Attorney, Agent, or Firm* — VIA LLP

(57) ABSTRACT

A surface acoustic wave device is disclosed. The surface acoustic wave device can include a single crystal support layer, an intermediate single crystal layer positioned over the single crystal support layer, a lithium based piezoelectric layer positioned over the intermediate single crystal layer, and an interdigital transducer electrode positioned over the lithium based piezoelectric layer, the surface acoustic wave device configured to generate a surface acoustic wave. The single crystal layer can be a quartz layer, such as a z-propagation quartz layer. A thermal conductivity of the single crystal support layer is greater than a thermal conductivity of the intermediate single crystal layer, and the thermal conductivity of the single crystal support layer is greater than a thermal conductivity of the lithium based piezoelectric layer.

20 Claims, 12 Drawing Sheets

Related U.S. Application Data continuation of application No. 17/067,543, filed on Oct. 9, 2020, now abandoned.

(60) Provisional application No. 62/913,590, filed on Oct. 10, 2019, provisional application No. 62/913,614, filed on Oct. 10, 2019.

(51) Int. Cl.
*H10N 30/40* (2023.01)
*H10N 30/50* (2023.01)

(58) Field of Classification Search
CPC ............. H03H 9/14541; H03H 9/6483; H03H 9/02574; H10N 30/40; H10N 30/50
See application file for complete search history.

(56) References Cited

U.S. PATENT DOCUMENTS 5,446,330 A 8/1995 Eda et al.
5,923,231 A 7/1999 Ohkubo et al.
7,105,980 B2 * 9/2006 Abbott ............... H03H 9/02984 310/313 R
7,213,314 B2 5/2007 Abbott et al.
10,084,427 B2 9/2018 Solal et al.
12,009,795 B2 6/2024 Abbott et al.
2002/0074899 A1 * 6/2002 Nakao ...................... H03H 3/08 310/313 R
2004/0036381 A1 2/2004 Abbott et al.
2008/0169724 A1 7/2008 Bhattacharjee et al.
2012/0139652 A1 6/2012 Yamanaka
2012/0194032 A1 8/2012 Kadota
2014/0225684 A1 * 8/2014 Kando ............... H03H 9/14594 333/195
2015/0028720 A1 1/2015 Kando
2015/0256144 A1 9/2015 Andosca et al.
2016/0261248 A1 * 9/2016 Grousset .................. H03H 9/54
2017/0222622 A1 8/2017 Solal et al.
2018/0159494 A1 6/2018 Goto et al.
2019/0074819 A1 3/2019 Goto et al.
2019/0267966 A1 * 8/2019 Hiratsuka .......... H03H 9/02574
2019/0326878 A1 * 10/2019 Kakita ................. H03H 9/6483
2021/0111688 A1 4/2021 Abbott et al.
2021/0111689 A1 4/2021 Abbott et al.

OTHER PUBLICATIONS

Takai et al., "High-Performance SAW Resonator on New Multilayered Substrate Using LiTaO3 Crystal", IEEE Transactions on Ultrasonics, Ferroelectrics, and Frequency Control, 64(9): 1382-1389 (Sep. 2017).

Takai et al., "Incredible High Performance SAW resonator on Novel Multi-layerd Substrate", IEEE International Ultrasonics Symposium Proceedings, 4 pgs. (2016).

* cited by examiner 14
16

12
10
14
16

14
16

10
14
16

16

10
14
16

ACOUSTIC WAVE DEVICE WITH MULTI-LAYER PIEZOELECTRIC SUBSTRATE

CROSS-REFERENCE TO RELATED APPLICATION

Any and all applications for which a foreign or domestic priority claim is identified in the Application Data Sheet, or any correction thereto, are hereby incorporated by reference under 37 CFR 1.57.

BACKGROUND

Technical Field

Embodiments of this disclosure relate to acoustic wave resonators.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

A surface acoustic wave resonator can include a multi-layer piezoelectric substrate. Such a surface acoustic wave resonator can achieve a high quality factor (Q). There is a desire for increased ruggedness and power handling of surface acoustic wave resonators with multi-layer piezoelectric substrates.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, a surface acoustic wave device. The surface acoustic wave device can include a single crystal support layer, an intermediate single crystal layer positioned over the single crystal support layer, a lithium based piezoelectric layer positioned over the intermediate single crystal layer, and an interdigital transducer electrode positioned over the lithium based piezoelectric layer. The surface acoustic wave device is configured to generate a surface acoustic wave.

In an embodiment, the single crystal support layer is a silicon layer.

In an embodiment, the single crystal support layer is an aluminum nitride layer.

In an embodiment, the single crystal support layer has a thickness greater than a half of a thickness of the surface acoustic wave device.

In an embodiment, the single crystal support layer has a thickness that is greater than a combined thickness of the intermediate single crystal layer and the lithium based piezoelectric layer.

In an embodiment, the single crystal support layer is capped with a trap rich layer on a side facing the intermediate single crystal layer.

In an embodiment, the intermediate single crystal layer is a quartz layer.

In an embodiment, the quartz layer has a first Euler angle φ in a range from 40° to 50°, a second Euler angle θ in a range from 85° to 95°, and a third Euler angle ψ in a range from 85° to 95°. The quartz layer can have a first Euler angle φ of approximately 45°, a second Euler angle θ of approximately 90°, and a third Euler angle ψ of approximately 90°. The quartz layer can have a first Euler angle φ in a range from −5° to 5°, a second Euler angle θ in a range from 120° to 170°, and a third Euler angle ψ in a range from −5° to 5°. The quartz layer can have a first Euler angle φ of approximately 0°, a second Euler angle θ in a range from 120° to 140°, and a third Euler angle ψ of approximately 0°. The quartz layer can have a first Euler angle φ in a range from −5° to 5°, a second Euler angle θ in a range from 120° to 170°, and a third Euler angle ψ in a range from 85° to 95°. The quartz layer can have a first Euler angle φ of approximately 0°, a second Euler angle θ in a range from 120° to 170°, and a third Euler angle ψ of approximately 90°. The quartz layer can be a z-propagation quartz layer having a second Euler angle θ in a range from 120° to 170°. In an embodiment, the intermediate single crystal layer has a thickness greater than 5λ. In an embodiment, the intermediate single crystal layer has a thickness in a range from 5λ to 20λ.

In an embodiment, the lithium based piezoelectric layer is a lithium tantalate layer. The lithium tantalate layer can have a second Euler angle θ in a range from 100° to 150°. The lithium tantalate layer can have a first Euler angle φ in a range from −5° to 5°, a second Euler angle θ in a range from 100° to 150°, and a third Euler angle ψ in a range from −5° to 5°. The lithium tantalate layer can have a first Euler angle φ of approximately 0°, a second Euler angle θ in a range from 100° to 150°, and a third Euler angle ψ of approximately 0°.

In an embodiment, the lithium based piezoelectric layer is a lithium niobate layer. The lithium niobate layer can have a second Euler angle θ in a range from 100° to 150. The lithium niobate layer can have a first Euler angle φ in a range from −5° to 5°, a second Euler angle θ in a range from 100° to 150°, and a third Euler angle ψ in a range from −5° to 5°. The lithium niobate layer can have a first Euler angle φ of approximately 0°, a second Euler angle θ in a range from 100° to 150°, and a third Euler angle ψ of approximately 0°. The lithium niobate layer can have a first Euler angle φ in a range from −5° to 5°, a second Euler angle θ in a range from 30° to 50°, and a third Euler angle ψ in a range from −5° to 5°. The lithium niobate layer can have a first Euler angle φ of approximately 0°, a second Euler angle θ in a range of approximately 0°, and a third Euler angle ψ of approximately 0°.

In an embodiment, the lithium based piezoelectric layer has a thickness in a range from 0.1λ to 2λ.

In an embodiment, the lithium based piezoelectric layer has a thickness in a range from 0.1λ to 1λ.

In an embodiment, a thermal conductivity of the single crystal support layer is greater than a thermal conductivity of the intermediate single crystal layer. The thermal conductivity of the single crystal support layer can be greater than a thermal conductivity of the lithium based piezoelectric layer.

In an embodiment, the surface acoustic wave device further includes an oxide layer between the single crystal support layer and the intermediate single crystal layer.

In an embodiment, the surface acoustic wave device further includes an oxide layer between the intermediate single crystal layer and the lithium based piezoelectric layer.

In one aspect, a surface acoustic wave device is disclosed. The surface acoustic wave device can include a support layer and a quartz layer over the support layer. The quartz layer has a lower thermal conductivity than the support layer. The surface acoustic wave device can also include a lithium based piezoelectric layer positioned over the quartz layer. The lithium based piezoelectric layer has a lower thermal conductivity than the support layer. The surface acoustic wave device can further include an interdigital transducer electrode positioned over the lithium based piezoelectric layer. The surface acoustic wave device is configured to generate a surface acoustic wave.

In an embodiment, the quartz layer is a z-propagation quartz layer.

In an embodiment, the support layer is a silicon layer.

In an embodiment, the support layer is an aluminum nitride layer.

In an embodiment, the support layer has a thickness greater than a half of a thickness of the surface acoustic wave device.

In an embodiment, the support layer has a thickness greater than a combined thickness of the quartz layer and the lithium based piezoelectric layer.

In an embodiment, the support layer is capped with a trap rich layer on a side facing the quartz layer. The quartz layer can have a first Euler angle φ in a range from 40° to 50°, a second Euler angle θ in a range from 85° to 95°, and a third Euler angle ψ in a range from 85° to 95°. The quartz layer can have a first Euler angle φ of approximately 45°, a second Euler angle θ of approximately 90°, and a third Euler angle ψ of approximately 90°. The quartz layer can have a first Euler angle φ in a range from −5° to 5°, a second Euler angle θ in a range from 120° to 140°, and a third Euler angle ψ in a range from −5° to 5°. The quartz layer can have a first Euler angle φ of approximately 0°, a second Euler angle θ in a range from 120° to 140°, and a third Euler angle ψ of approximately 0°. The quartz layer can have a first Euler angle φ in a range from −5° to 5°, a second Euler angle θ in a range from 120° to 140°, and a third Euler angle ψ of in a range from 85° to 95°. The quartz layer can have a first Euler angle φ of approximately 0°, a second Euler angle θ in a range from 120° to 140°, and a third Euler angle ψ of approximately 90°.

In an embodiment, the quartz layer is a z-propagation quartz layer that has a second Euler angle θ in a range from 120° to 140°.

In an embodiment, the quartz layer has a thickness greater than about 5λ, and λ is a wavelength of the surface acoustic wave.

In an embodiment, the quartz layer has a thickness in a range from 5λ to 20λ, and λ is a wavelength of the surface acoustic wave.

In an embodiment, the lithium based piezoelectric layer is a lithium tantalate layer. The lithium tantalate layer can have a second Euler angle θ in a range from 100° to 150°. The lithium tantalate layer can have a first Euler angle φ in a range from −5° to 5°, a second Euler angle θ in a range from 100° to 150°, and a third Euler angle ψ in a range from −5° to 5°. The lithium tantalate layer can have a first Euler angle φ of approximately 0°, a second Euler angle θ in a range from 100° to 150°, and a third Euler angle ψ of approximately 0°.

In an embodiment, the lithium based piezoelectric layer is a lithium niobate layer. The lithium niobate layer can have a second Euler angle θ in a range from 100° to 150°. The lithium niobate layer can have a first Euler angle φ in a range from −5° to 5°, a second Euler angle θ in a range from 100° to 150°, and a third Euler angle ψ in a range from −5° to 5°. The lithium niobate layer can have a first Euler angle φ of approximately 0°, a second Euler angle θ in a range from 100° to 150°, and a third Euler angle ψ of approximately 0°. The lithium niobate layer can have a first Euler angle φ in a range from −5° to 5°, a second Euler angle θ in a range from 30° to 50°, and a third Euler angle ψ in a range from −5° to 5°. The lithium niobate layer can have a first Euler angle φ of approximately 0°, a second Euler angle θ in a range of approximately 0°, and a third Euler angle ψ of approximately 0°.

In an embodiment, the lithium based piezoelectric layer has a thickness in a range from 0.1λ to 2λ.

In an embodiment, the lithium based piezoelectric layer has a thickness in a range from 0.1λ to 1λ.

In an embodiment, the surface acoustic wave device further includes an oxide layer between the support layer and the quartz layer.

In an embodiment, the surface acoustic wave device further include an oxide layer between the quartz layer and the lithium based piezoelectric layer.

In an embodiment, the surface acoustic wave device further includes a silicon dioxide layer between the support layer and the z-propagation quartz layer.

In an embodiment, the surface acoustic wave device further includes a silicon dioxide layer between the z-propagation quartz layer and the lithium based piezoelectric layer.

In an embodiment, the surface acoustic wave device further includes a first silicon dioxide layer between the support layer and the z-propagation quartz layer, and a second silicon dioxide layer between the z-propagation quartz layer and the lithium based piezoelectric layer.

In an embodiment, an acoustic wave filter for filtering a radio frequency signal is disclosed. The acoustic wave filter can include a surface acoustic wave device disclosed herein. A radio frequency module can include the acoustic wave filter of, and a radio frequency circuit element that is coupled to the acoustic wave filter. The acoustic wave filter and the radio frequency circuit element are enclosed within a common package. A wireless communication device can include a radio frequency amplifier, a transceiver in communication with the radio frequency amplifier, an antenna, and the acoustic wave filter. The acoustic wave filter is in a signal path between the radio frequency amplifier and the antenna. A method of filtering a radio frequency signal. The method can include receiving a radio frequency signal at a port of the acoustic wave filter, and filtering the radio frequency signal with the acoustic wave filter.

In one aspect, a surface acoustic wave device is disclosed. The surface acoustic wave device can include a support layer, and a z-propagation quartz layer positioned over the support layer. The support layer has a thermal conductivity higher than a thermal conductivity of the z-propagation quartz layer. The surface acoustic wave device can also include a lithium based piezoelectric layer positioned over the quartz layer. The thermal conductivity of the support layer being higher than a thermal conductivity of the lithium based piezoelectric layer. The surface acoustic wave device can further include an interdigital transducer electrode positioned over the lithium based piezoelectric layer. The surface acoustic wave device is configured to generate a surface acoustic wave.

In an embodiment, the support layer is a spinel support layer or a silicon support layer.

In an embodiment, the thermal conductivity of the support layer is at least double the thermal conductivity of the a z-propagation quartz layer.

In one aspect, a method of manufacturing an acoustic wave device is disclosed. The method can include bonding a support substrate to a first side of a quartz layer. The method can also include bonding a piezoelectric layer to a second side of the quartz layer. The second side is opposite to the first side. The method further include forming an interdigital transducer electrode to a side of the piezoelectric layer that is opposite the quartz layer.

In an embodiment, the method further includes thinning the quartz layer after the bonding the support substrate to the first side of the quartz layer.

In an embodiment, the method further includes thinning the piezoelectric layer after the bonding the piezoelectric layer to the second side of the quartz layer.

In an embodiment, the bonding the support substrate to the first side of the quartz substrate is performed such that an adhesion layer is positioned between the support substrate and the first side of the quartz substrate.

In an embodiment, the bonding the piezoelectric layer to the second side of the quartz substrate is performed such that an adhesion layer is positioned between the piezoelectric layer and the second side of the quartz substrate.

In an embodiment, wherein the support substrate includes silicon.

In an embodiment, the support substrate has a higher thermal conductivity than both the quartz layer and the piezoelectric layer.

In an embodiment, the piezoelectric layer is a lithium based piezoelectric layer.

In an embodiment, the quartz layer is a z-propagation quartz layer.

In an embodiment, the quartz layer has a first Euler angle φ of approximately 45°, a second Euler angle θ of approximately 90°, and a third Euler angle ψ of approximately 90°.

In an embodiment, the quartz layer has a first Euler angle φ of approximately 0°, a second Euler angle θ in a range from 120° to 140°, and a third Euler angle ψ of approximately 0°.

In an embodiment, the quartz layer has a first Euler angle φ of approximately 0°, a second Euler angle θ in a range from 120° to 140°, and a third Euler angle ψ of approximately 90°.

A method of manufacturing an acoustic wave device is disclosed. The method can include bonding a single crystal support substrate to a first side of an intermediate single crystal layer. The method can also include bonding a lithium based piezoelectric layer to a second side of the intermediate single crystal layer. The second side is opposite to the first side. The method can further include forming an interdigital transducer electrode to a side of the lithium based piezoelectric layer that is opposite the intermediate single crystal layer.

In an embodiment, the method further include thinning the intermediate single crystal layer after the bonding the single crystal support substrate to the first side of the intermediate single crystal layer.

In an embodiment, the method further includes thinning the lithium based piezoelectric layer after the bonding the lithium based piezoelectric layer to the second side of the intermediate single crystal layer.

In an embodiment, the bonding the single crystal support substrate to the first side of the intermediate single crystal substrate is performed such that an adhesion layer is positioned between the single crystal support substrate and the first side of the intermediate single crystal substrate.

In an embodiment, the bonding the lithium based piezoelectric layer to the second side of the intermediate single crystal substrate is performed such that an adhesion layer is positioned between the lithium based piezoelectric layer and the second side of the intermediate single crystal substrate.

In an embodiment, the single crystal support substrate includes silicon.

In an embodiment, the single crystal support substrate has a higher thermal conductivity than both the intermediate single crystal layer and the lithium based piezoelectric layer.

In an embodiment, the intermediate single crystal layer is a z-propagation quartz layer.

In an embodiment, the intermediate single crystal layer is a quartz layer having a first Euler angle φ of approximately 45°, a second Euler angle θ of approximately 90°, and a third Euler angle ψ of approximately 90°.

In an embodiment, the intermediate single crystal layer is a quartz layer having a first Euler angle φ of approximately 0°, a second Euler angle θ in a range from 120° to 140°, and a third Euler angle ψ of approximately 0°.

In an embodiment, the intermediate single crystal layer is a quartz layer having a first Euler angle φ of approximately 0°, a second Euler angle θ in a range from 120° to 140°, and a third Euler angle ψ of approximately 90°.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
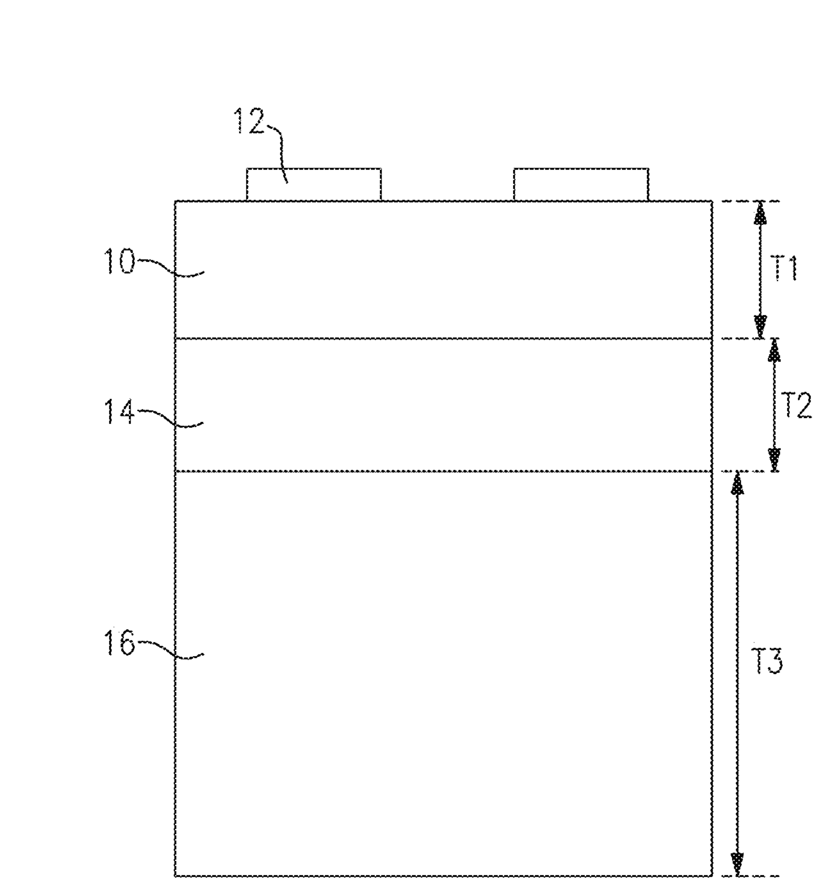
FIG. 1 illustrates a cross section of a surface acoustic wave (SAW) resonator according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. The certain SAW devices may be referred to as SAW resonators. Any features of the SAW resonators discussed herein can be implemented in any suitable SAW device.

In general, high quality factor (Q), large effective electromechanical coupling coefficient ($k^2$), high frequency ability, and spurious free response can be significant aspects for acoustic wave elements to enable low-loss filters, delay lines, stable oscillators, and sensitive sensors.

Multi-layer piezoelectric substrate (MPS) SAW resonators can thermally insulate an interdigital transducer electrode and a piezoelectric layer. By reducing dissipative thermal impedance of the SAW device, the ruggedness and power handling can be improved.

Some MPS SAW resonators have achieved high Q by confining energy and good thermal dissipation using a silicon (Si) support layer. However, such approaches have encountered technical challenges related to undesirable higher frequency spurious responses.

Some other MPS SAW resonators have achieved high Q by confining energy and have also reduced higher frequency spurious responses. However, such approaches have encountered relatively low thermal heat dissipation.

Aspects of the present disclosure relate to SAW resonators that include a supporting substrate (e.g., a single crystal supporting substrate), a quartz layer (e.g., a z-propagation quartz layer) over the supporting substrate, a piezoelectric layer (e.g., a lithium niobate (LN) layer or a lithium tantalate (LT) layer) over the quartz layer, and an interdigital transducer (IDT) electrode over the piezoelectric layer. Such SAW resonators can also include a temperature compensation layer (e.g., silicon dioxide ($SiO_2$) layer) over the IDT electrode in certain embodiments. The SAW resonators can also include an adhesion layer disposed between the supporting substrate and the quartz layer and/or an adhesion layer between the quartz layer and the piezoelectric layer, in certain applications.

SAW resonators with the quartz layer and the support substrate can beneficially provide a relatively high effective electromechanical coupling coefficient ($k^2$), a relatively high quality factor (Q), a relatively high power durability and thermal dissipation, and reduced high frequency spurious responses. The high coupling coefficient ($k^2$) can be beneficial for relatively wide bandwidth filters. The high quality factor (Q) can beneficially lead to a relatively low insertion loss. The reduced high frequency spurious may make the SAW resonators compatible with multiplexing with higher frequency bands.

In an embodiment, an MPS SAW resonator includes a piezoelectric layer over a quartz layer over a silicon support substrate. The silicon support substrate can reduce thermal impedance of the MPS SAW resonator. The quartz layer can be a single crystal layer arranged to confine acoustic energy and lower a higher frequency spurious response. The quartz layer can be a z-propagation quartz layer. The piezoelectric layer, the quartz layer, and the silicon support substrate can all be single crystal layers.

Embodiments of MPS SAW resonators will now be discussed. Any suitable principles and advantages of these MPS SAW resonators can be implemented together with each other in an MPS SAW resonator and/or in an acoustic wave filter. MPS SAW resonators disclosed herein can have lower loss than certain bulk acoustic wave devices.

FIG. 1 illustrates a cross section of a surface acoustic wave (SAW) resonator 1 according to an embodiment. The illustrated SAW resonator 1 includes a piezoelectric layer 10, an interdigital electrode transducer (IDT) electrode 12 over the piezoelectric layer 10, a quartz layer 14 below the piezoelectric layer 10, and a support substrate 16 below the quartz layer 14. In the SAW resonator 1, the piezoelectric layer 10, the quartz layer 14, and the support substrate 16 can each be a single crystal layer. The SAW resonator 1 generates a surface acoustic wave having a wavelength $\lambda$ or L.

The piezoelectric layer 10 can be any suitable piezoelectric layer, such as a lithium based piezoelectric layer. In some embodiments, the piezoelectric layer 10 can be a lithium niobate (LN) layer or a lithium tantalate (LT) layer. The piezoelectric layer 10 has an orientation that can be expressed in Euler angles ($\varphi$, $\theta$, $\psi$).

In certain applications, the piezoelectric layer 10 can be an LN layer having a first Euler angle $\varphi$ in a range from −5° to 5° (e.g., approximately 0°), a second Euler angle $\theta$ in a range from 100° to 150°, and a third Euler angle $\psi$ in a range from −5° to 5° (e.g., approximately 0°). Such a second Euler angle $\theta$ corresponds to an YX cut angle in a range from 10° to 60°. As an example, an LN layer piezoelectric layer 10 can have Euler angles ($\varphi$=0°, $\theta$=a value in a range from 100° to 150°, $\psi$=0°).

In some applications, the piezoelectric layer 10 can be an LN layer having a first Euler angle φ in a range from −5° to 5° (e.g., approximately 0°), a second Euler angle θ in a range from 20° to 50° (e.g., approximately 38°), and a third Euler angle ψ in a range from −5° to 5° (e.g., approximately 0°). Such a second Euler angle θ corresponds to an YX cut angle in a range from −70° to −40°. As an example, an LN layer piezoelectric layer 10 can have Euler angles (φ=0°, θ=a value in a range from 100° to 150°, ω=0°).

In some applications, the piezoelectric layer 10 can be an LN layer having a y-rotated angle in a range from 120° to 140° in a Rayleigh mode. In some applications, the piezoelectric layer 10 can be an LN layer having a low cut with y-rotated angle in a range from −20° to 40°. According to some applications, the piezoelectric layer 10 can be an LT layer having a first Euler angle φ in a range from −5° to 5° (e.g., approximately 0°), a second Euler angle θ in a range from 100° to 150°, and a third Euler angle ψ in a range from −5° to 5° (e.g., approximately 0°). Such as Euler angle θ corresponds to an YX cut angle in a range from 10° to 60°. As an example, an LT layer piezoelectric layer 10 can have Euler angles (φ=0°, θ=38° to 150°, ψ=0°). As another example, an LT layer piezoelectric layer 10 can have a y-rotated angle in a range from 0° to 60°.

Figure 5:
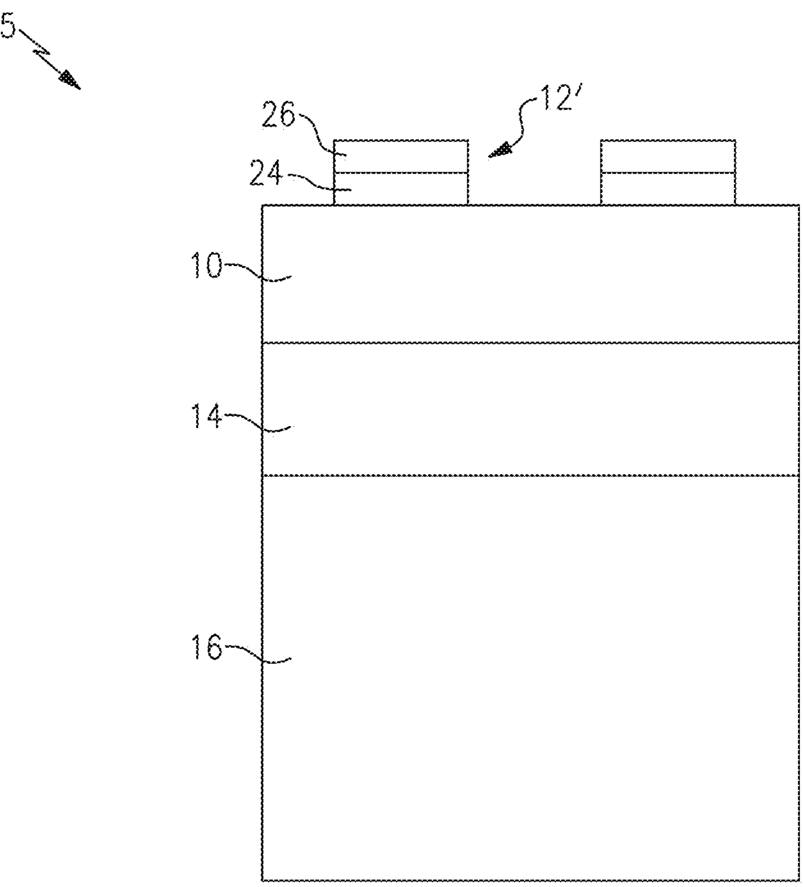
FIG. 5 illustrates a cross section of a SAW resonator according to another embodiment.

The IDT electrode 12 can include any suitable IDT electrode material. For example, the IDT electrode can include molybdenum (Mo), aluminum (Al), copper (Cu), Magnesium (Mg), titanium (Ti), tungsten (W), the like, or any suitable combination thereof. The IDT electrode 12 may include alloys, such as AlMgCu, AlCu, etc. In some embodiments, the IDT electrode 12 can include a plurality of layers of IDT electrode materials, for example, as illustrated in FIG. 5.

The illustrated surface acoustic wave resonator 1 includes the quartz layer 14. The quartz layer 14 can be a single crystal quartz layer. The quartz layer 14 is an example of a single crystal layer. Any other suitable single crystal layer that has a thermal conductivity greater than a thermal conductivity of the piezoelectric layer 10 can be implemented in place of any of the quartz layers disclosed herein.

The quartz layer 14 can be a z-propagation quartz layer. A z-propagation quartz refers to a quartz layer that has a propagation direction along the z-direction of the quartz layer. A surface acoustic wave resonator 1 with a z-propagation quartz layer as the quartz layer 14 can beneficially provide a higher coupling factor ($k^2$), a higher quality factor (Q), and higher power durability by confining the acoustic energy, as compared to a similar surface acoustic wave resonator that does not include a z-propagation quartz layer. A z-propagation quartz layer can reduce higher frequency spurious modes.

The quartz layer 14 has an orientation that can be expressed in Euler angles (φ, θ, ψ). In certain applications, the quartz layer 14 can be a z-propagation quartz layer having a first Euler angle φ in a range from 40° to 50° (e.g., approximately 45°), a second Euler angle θ in a range from 80° to 120° (e.g., approximately 90°), and a third Euler angle ψ in a range from 85° to 95° (e.g., approximately 45°). As an example, such a quartz layer 14 can have Euler angles (φ=45°, θ=90°, ψ=45°).

In some applications, the quartz layer 14 can be a z-propagation quartz layer having a first Euler angle φ in a range from −5° to 5° (e.g., approximately 0°), a second Euler angle θ in a range from 110° to 150° (e.g., approximately 132°), and a third Euler angle ψ in a range from −5° to 5° (e.g., approximately 0°). As an example, such a quartz layer 14 can have Euler angles (φ=0°, θ=132°, ψ=0°).

According to some applications, the quartz layer 14 can be a z-propagation quartz layer having a first Euler angle φ in a range from −5° to 5° (e.g., approximately 0°), a second Euler angle θ in a range from 110° to 170° (e.g., approximately 132°), and a third Euler angle ψ in a range from 85° to 95° (e.g., approximately 90°). As an example, such a quartz layer 14 can have Euler angles (φ=0°, θ=132°, ψ=90°). The quartz layer 14 with such Euler angle ranges can improve temperature coefficient of frequency (TCF) relative to a quartz layer with Euler angles outside of the Euler angle ranges.

The support substrate 16 has a greater thermal conductivity than the thermal conductivity of the quartz layer 14 and/or than the thermal conductivity of the piezoelectric layer 10. For example, the support substrate 16 can have a thermal conductivity that is at least double the thermal conductivity of the quartz layer or at least 10 times the thermal conductivity of the quartz layer 14. The surface acoustic wave resonator 1 with the support substrate 16 that has a greater thermal conductivity than the quartz layer 14 can reduce the thermal impedance and be more durable than a similar surface acoustic wave resonator without the support substrate 16 or with a support substrate that does not have a greater thermal conductivity than quartz layer 14. The support substrate 16 can be a single crystal layer. The support substrate 16 can include, for example, silicon (Si), sapphire, aluminum oxide ($Al_2O_3$), aluminum nitride (AlN), etc. In some embodiments, the support substrate 16 can be a spinel substrate. The spinel substrate can be a polycrystalline spinel substrate. The polycrystalline spinel substrate can be a magnesium aluminate ($MgAl_2O_4$) spinel substrate. The support substrate can include a ceramic substrate that can have, for example, polycrystalline spinel (e.g., $MgAl_2O_4$ which can be referred to as a magnesium aluminate spinel), co-fired ceramic, sapphire ($Al_2O_3$), silicon carbide (SiC), or polycrystalline aluminum nitride (AlN). The support substrate 16 can include a trap rich layer may be formed at or near a surface of the support substrate 16 facing the quartz layer 14. The support substrate 16 has a lower line expansion than the quartz layer 14 in certain applications. In such applications, temperature coefficient of frequency (TCF) may be improved.

The piezoelectric layer 10 has a thickness T1. The thickness T1 of the piezoelectric layer 10 can be selected based on a wavelength λ or L of a surface acoustic wave generated by the surface acoustic wave resonator 1. The IDT electrode 12 has a pitch that sets the wavelength λ or L of the surface acoustic wave device 1. The piezoelectric layer 10 can be sufficiently thick to avoid significant frequency variation. In some embodiments, the thickness T1 of the piezoelectric layer 10 can be in a range from, 0.1λ to 2λ, in a range from 0.1λ to 1.5λ, in a range from 0.1λ to 1λ. The thickness T1 of the piezoelectric layer 10 can contribute to a quality factor (Q) of the surface acoustic wave resonator 1. When the piezoelectric layer 10 has a thickness less than the wavelength λ of the surface acoustic wave generated by the surface acoustic wave resonator 1, a relatively high quality factor (Q) may be obtained. As noted above, the piezoelectric layer 10 may include any suitable piezoelectric layer, such as a lithium niobate (LN) layer or a lithium tantalate (LT) layer.

The quartz layer 14 has a thickness T2. The thickness T2 of the quartz layer 14 can be determined at least in part by, for example, the thermal conductivity performance of the surface acoustic wave resonator 1. In some embodiments, the thickness T2 of the quartz layer 14 can be greater than 5λ. In certain embodiments, the thickness T2 of the quartz layer 14 can be in a range from, for example, 5λ to 50λ. In some such embodiments, the thickness T2 of the quartz layer 14 can be in a range from, for example, 5λ to 20λ.

The support substrate 16 has a thickness T3. The thickness T3 of the support substrate 16 can be determined at least in part by, for example, the thermal conductivity performance of the surface acoustic wave resonator 1. The thickness T3 of the support substrate 16 can be determined at least in part by, for example, the total thickness of the surface acoustic wave resonator 1. In some embodiments, the thickness T3 of the support substrate 16 can be at least one half the total thickness of the surface acoustic wave resonator 1. In some embodiments, the thickness T3 of the support substrate 16 can be greater than a sum of the thickness T1 of the piezoelectric layer 10 and the thickness T2 of the quartz layer 14. In such cases, T3>T1+T2.

FIGS. 2-5 illustrate variations of SAW resonators according to some embodiments. Any suitable combination and or substitution of features of FIGS. 1-5 can be combined with each other.

Figure 2:
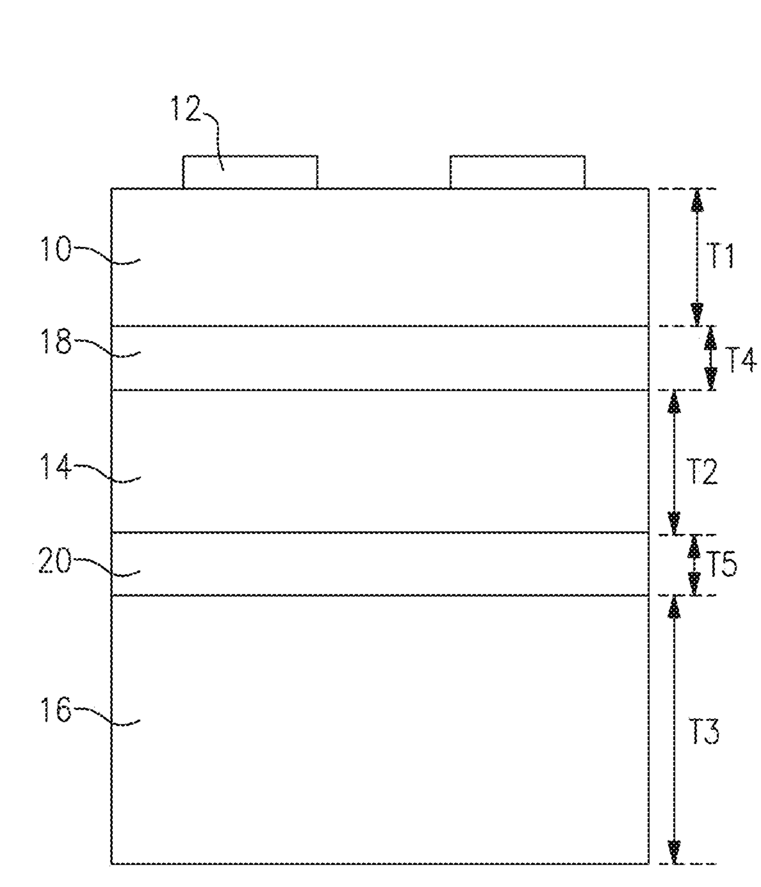
FIG. 2 illustrates a cross section of a surface acoustic wave SAW resonator according to another embodiment.

FIG. 2 illustrates a cross section of a SAW resonator 2 according to an embodiment. As in the surface acoustic wave resonator 1 of FIG. 1, the illustrated surface acoustic wave resonator 2 includes a piezoelectric layer 10, an IDT electrode 12 over the piezoelectric layer 10, a quartz layer 14 below the piezoelectric layer 10, and a support substrate 16 below the quartz layer 14. The surface acoustic wave resonator 2 also includes a first oxide layer 18 between the piezoelectric layer 10 and the quartz layer 14, and a second oxide layer 20 between the quartz layer 14 and the support substrate 16. The first oxide layer 18 and the second oxide layer 20 can be provided by way of deposition. Although oxide layers 18 and 20 are shown in FIG. 2, a single one of the oxide layers 18 or 20 can be included in a SAW resonator in some other embodiments. The surface acoustic wave resonator 2 generates a surface acoustic wave having a wavelength λ or L.

The first oxide layer 18 and/or the second oxide layer 20 may act as adhesion layers. Any other suitable adhesion layer can alternatively be implemented in place of the first oxide layer 18 and/or the second oxide layer 20. The first oxide layer 18 and/or the second oxide layer 20 can include a thermal oxide. In some embodiments, the first oxide layer 18 and/or the second oxide layer 20 can include silicon dioxide ($SiO_2$). In such embodiments, the temperature coefficient of frequency (TCF) may be improved. In some embodiments, the second oxide layer 20 can include a trap rich layer for the support substrate 16.

Thicknesses T4, T5 of the first oxide layer 18 and the second oxide layer 20 can be relatively thin. In some embodiments, a combined thickness of the thickness T2 of the quartz layer, and the thicknesses T4 and T5 of the first and second oxide layers 18 and 20, respectively, can be smaller than, for example, 50λ.

Figure 3:
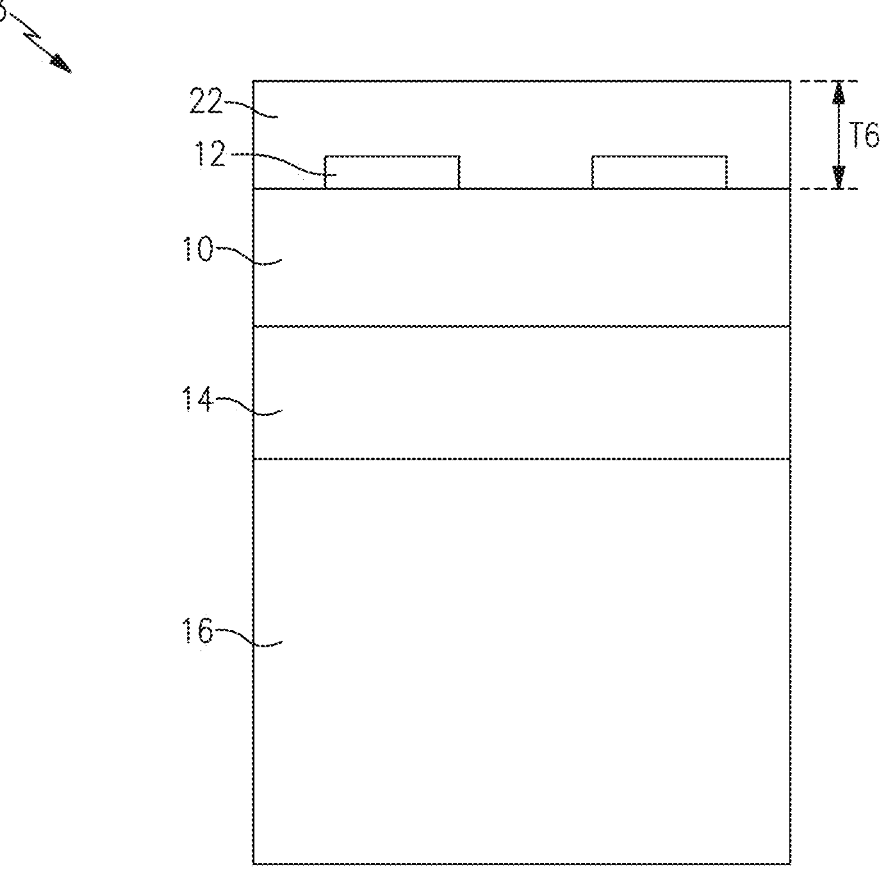
FIG. 3 illustrates a cross section of a SAW resonator according to another embodiment.

FIG. 3 illustrates a cross section of a SAW resonator 3 according to an embodiment. As in the surface acoustic wave resonator 1 of FIG. 1, the illustrated surface acoustic wave resonator 3 includes a piezoelectric layer 10, an IDT electrode 12 over the piezoelectric layer 10, a quartz layer 14 below the piezoelectric layer 10, and a support substrate 16 below the quartz layer 14. The surface acoustic wave resonator 2 also includes a temperature compensation layer 22. As illustrated, the temperature compensation layer 22 is over the IDT electrode 12 such that the IDT electrode 12 is positioned between the piezoelectric layer 10 and the temperature compensation layer 22. In certain applications, the temperature compensation layer 22 is included in SAW resonators with a piezoelectric layer 10 that includes LN. The surface acoustic wave resonator 3 generates a surface acoustic wave having a wavelength λ or L.

The temperature compensation layer 22 can bring the TCF of the surface acoustic wave resonator 3 closer to zero to thereby provide temperature compensation. The temperature compensation layer 22 can improve the electromechanical coupling coefficient $k^2$ of the SAW resonator 3 relative to a similar SAW resonator without the temperature compensation layer 22. This advantage of the temperature compensation layer 22 can be more pronounced when the piezoelectric layer 10 includes lithium niobate.

The temperature compensation layer 22 may include any suitable temperature compensation material that has a positive temperature coefficient of frequency. For instance, the temperature compensation layer 22 can be a silicon dioxide ($SiO_2$) layer, a tellurium dioxide ($TeO_2$) layer or a silicon oxyfluoride (SiOF) layer in certain applications. A temperature compensation layer can include any suitable combination of $SiO_2$, $TeO_2$, and/or SiOF. The temperature compensation layer 22 having a positive TCF can compensate for the piezoelectric layer 10 having a negative TCF.

The temperature compensation layer 22 has a thickness T6. The thickness T6 of the temperature compensation layer 22 can be determined at least in part by, for example, the thermal conductivity performance of the surface acoustic wave resonator 3. In some embodiments, the thickness T6 of the temperature compensation layer 22 can be in a range from 0.1λ to 0.5λ.

Figure 4:
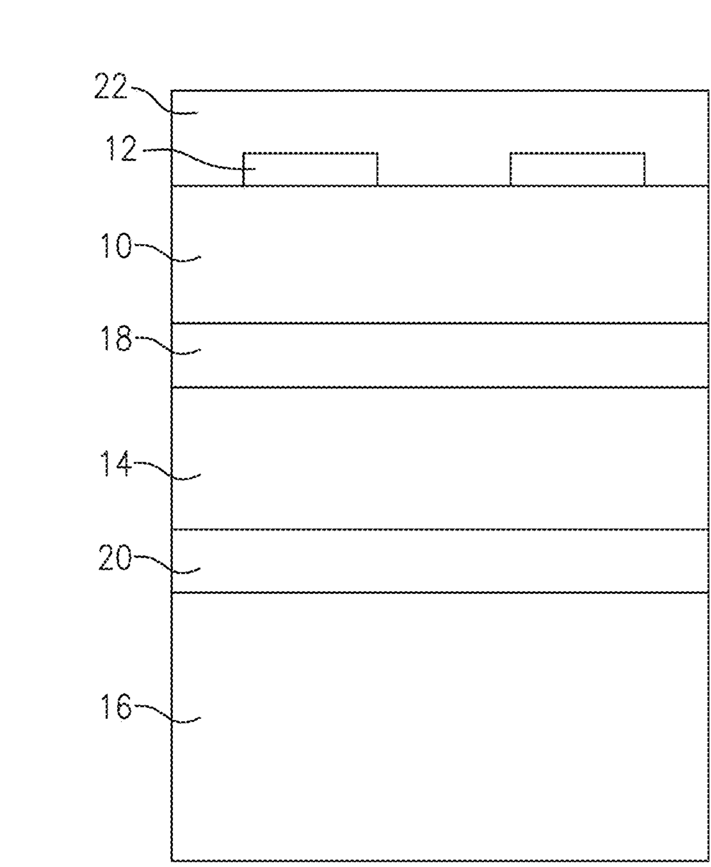
FIG. 4 illustrates a cross section of a SAW resonator according to another embodiment.

FIG. 4 illustrates a cross section of a SAW resonator 4 according to an embodiment. As in the surface acoustic wave resonator 2 of FIG. 2, the illustrated surface acoustic wave resonator 3 includes a piezoelectric layer 10, an IDT electrode 12 over the piezoelectric layer 10, a quartz layer 14 below the piezoelectric layer 10, a support substrate 16 below the quartz layer 14, a first oxide layer 18 between the piezoelectric layer 10 and the quartz layer 14, and a second oxide layer 20 between the quartz layer 14 and the support substrate 16. The surface acoustic wave resonator 4 also includes a temperature compensation layer 22. The surface acoustic wave resonator 4 generates a surface acoustic wave having a wavelength λ or L.

FIG. 5 illustrates a cross section of a SAW resonator 5 according to an embodiment. The SAW resonator 5 is like the in the SAW resonator 1 of FIG. 1, except that the SAW resonator 34 includes a multi-layer IDT electrode 12' instead of the IDT electrode 12.

The multi-layer IDT electrode 12' illustrated in FIG. 5 includes a lower layer 24 and an upper layer 26. For example, the multi-layer IDT electrode 12' can include a molybdenum (Mo) layer as the lower layer 24, and an aluminum (Al) layer as the upper layer 26. The multi-layer IDT electrode 12' may include other metals, such as, copper (Cu), Magnesium (Mg), titanium (Ti), tungsten (W), etc. The multi-layer IDT electrode 12' may include alloys, such as AlMgCu, AlCu, etc. In some instances, the multi-layer IDT electrode 12' can include three or more layers.

Figure 6B:
FIG. 6B is a thermal image that shows a result of thermal simulation of a SAW resonator according to an embodiment.
Figure 6B:
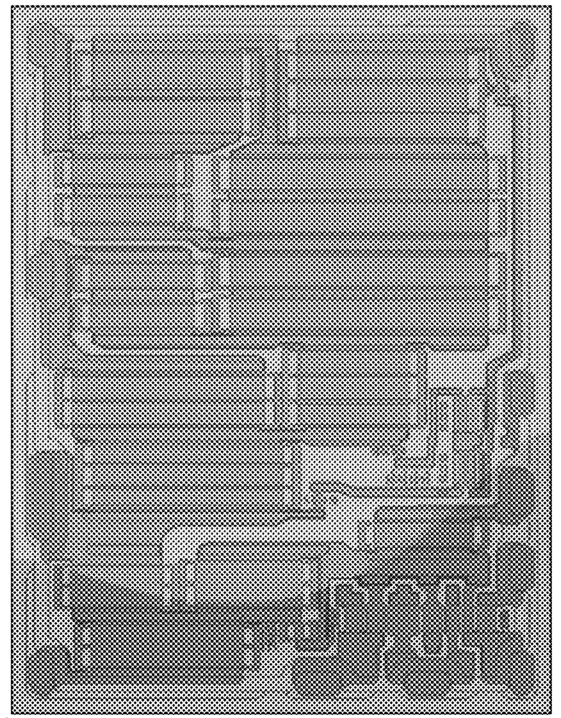
Figure 6B:
Figure 6A:
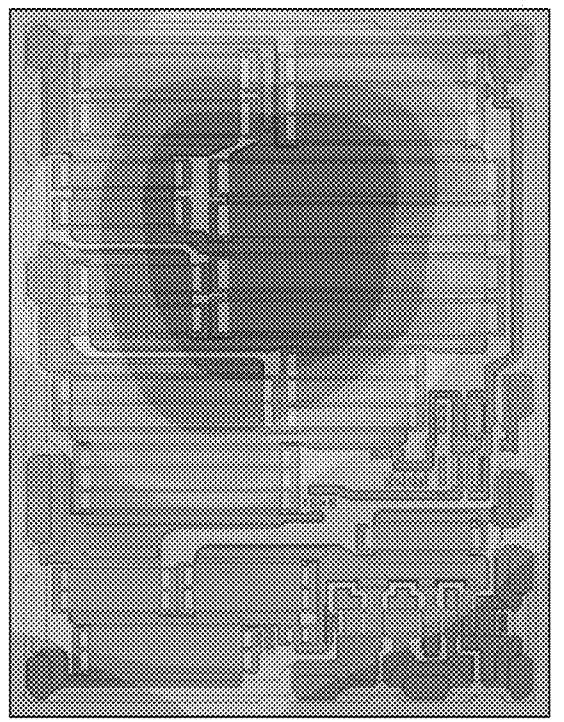
FIG. 6A is a thermal image that shows a result of thermal simulation of a SAW resonator.
Figure 6A:

FIG. 6A is a thermal image that shows a result of thermal simulation of a SAW die 6. The surface acoustic wave die 6 includes a SAW resonator with a lithium tantalate piezoelectric layer without a quartz layer and without a support substrate.

FIG. 6B is a thermal image that shows a result of thermal simulation of a SAW die 7 according to an embodiment. The surface acoustic wave die 6 used in the simulation includes the surface acoustic wave resonator 1 illustrated in FIG. 1. The surface acoustic wave resonator of the SAW die 7 includes a lithium tantalate layer having a cut angle of 42° (42° YX $LiTaO_3$) or a second Euler angle θ=132°, as the piezoelectric layer 10. The surface acoustic wave resonator of the SAW die 7 includes a quartz layer having an orientation in Euler angles (45°, 90°, 90°), as the quartz layer 14. The surface acoustic wave resonator of the SAW die 7 includes a silicon (Si) layer, as the support substrate 16.

The simulation result of FIG. 6A indicates that a maximum chip temperature of the surface acoustic wave die 6 during operation is about 119° C. The simulation result of FIG. 6B indicates that a maximum chip temperature of the surface acoustic wave die 7 during operation is about 43° C. Accordingly, the maximum temperature of the surface acoustic wave die 7 is significantly lower than the maximum temperature of the surface acoustic wave die 6. In the examples corresponding to FIGS. 6A and 6B, the maximum temperature of the surface acoustic wave die 7 is about 76° C. lower than the maximum temperature of the surface acoustic wave die 6. This difference in temperature can be due to at least the presence of the quartz layer and the silicon layer. Simulation data indicate that the silicon layer of the SAW resonator corresponding to FIG. 6B can reduce the maximum chip temperature by about 25° C. compared to an SAW resonator with an LT piezoelectric layer and a quartz layer (and without a silicon layer) having the same combined thickness as the LT layer, quartz layer, and silicon support substrate in the SAW resonator 1 corresponding to FIG. 6B.

Figures 7A, 7B, 7C, 7D, 7E, 7F:
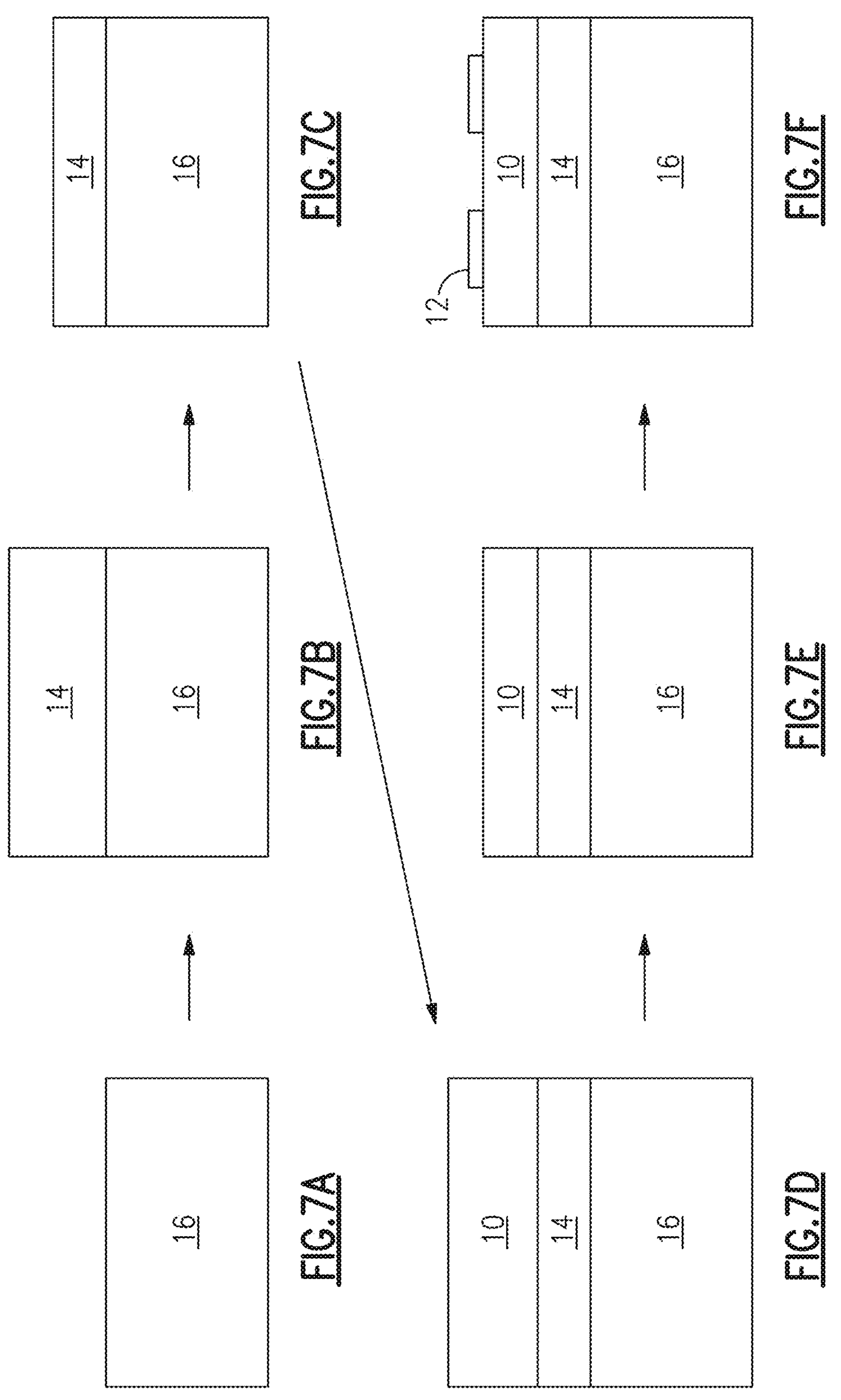
FIG. 7A-7F show cross-sections of a SAW resonator during a process flow of manufacturing the SAW resonator according to an embodiment.

FIG. 7A-7F show cross-sectional view of a SAW resonator during a process of manufacturing the SAW resonator according to an embodiment. In FIG. 7A, a support substrate 16 is provided. In some embodiments, the support substrate 16 can be pre-processed to have a suitable thickness. The support substrate 16 can include a silicon (Si) layer and/or consist essentially of Si.

In FIG. 7B, a quartz layer 14 is provided over the support substrate 16. The illustrated quartz layer 14 is bonded to the support substrate 16. The quartz layer 14 can include a z-propagation quartz layer. In some embodiments, the quartz layer 14 can be adhered to the support substrate 16 by way of an adhesion layer and/or material. The adhesion layer can include, for example, an oxide layer (e.g., a silicon dioxide ($SiO_2$) layer). In some embodiments, a trap rich layer may be formed at or near a surface of the support substrate 16 that interfaces the quartz layer 14.

In FIG. 7C, the quartz layer 14 is thinned to a suitable thickness. The thinning process can include, for example, etching and/or grinding. In some embodiments, the quartz layer 14 can be thinned to a thickness in a range from 5λ to 50λ.

In FIG. 7D, a piezoelectric layer 10 is provided over the quartz layer 14. The illustrated piezoelectric layer 10 is bonded to the quartz layer 14. In some embodiments, the piezoelectric layer 10 can be adhered to the quartz layer 14 by way of an adhesion layer and/or material. The adhesion layer can include, for example, an oxide layer (e.g., a $SiO_2$ layer). The piezoelectric layer 10 can include a lithium based piezoelectric layer (e.g., a lithium tantalate layer or a lithium niobate layer).

In FIG. 7E, the piezoelectric layer 10 can be thinned to a suitable thickness. The thinning process can include, for example, etching and/or grinding. In some embodiments, the piezoelectric layer 10 can be thinned to a thickness in a range from 0.1λ to 2λ.

In FIG. 7F, an IDT electrode 12 is provided. The IDT electrode 12 is formed over the piezoelectric layer. The formation of the IDT electrode 12 can include, for example, a photolithography process. The IDT electrode 12 has a pitch that sets the wavelength λ or L of the surface acoustic wave device. In some embodiments, a temperature compensation layer can be provided over the IDT electrode 12. The temperature compensation layer can be provided by way of, for example, deposition.

An MPS SAW resonator including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS SAW resonators disclosed herein. FR1 can be from 410 MHz to 7.125 GHZ, for example, as specified in a current 5G NR specification. In 5G applications, the thermal dissipation of the MPS SAW resonators disclosed herein can be advantageous. For example, such thermal dissipation can be desirable in 5G applications with a higher time-division duplexing (TDD) duty cycle compared to fourth generation (4G) Long Term Evolution (LTE). One or more MPS SAW resonators in accordance with any suitable principles and advantages disclosed herein can be included in a filter arranged to filter a radio frequency signal in a 4G LTE operating band and/or in a filter having a passband that includes a 4G LTE operating band and a 5G NR operating band.

Figures 8A, 8B:
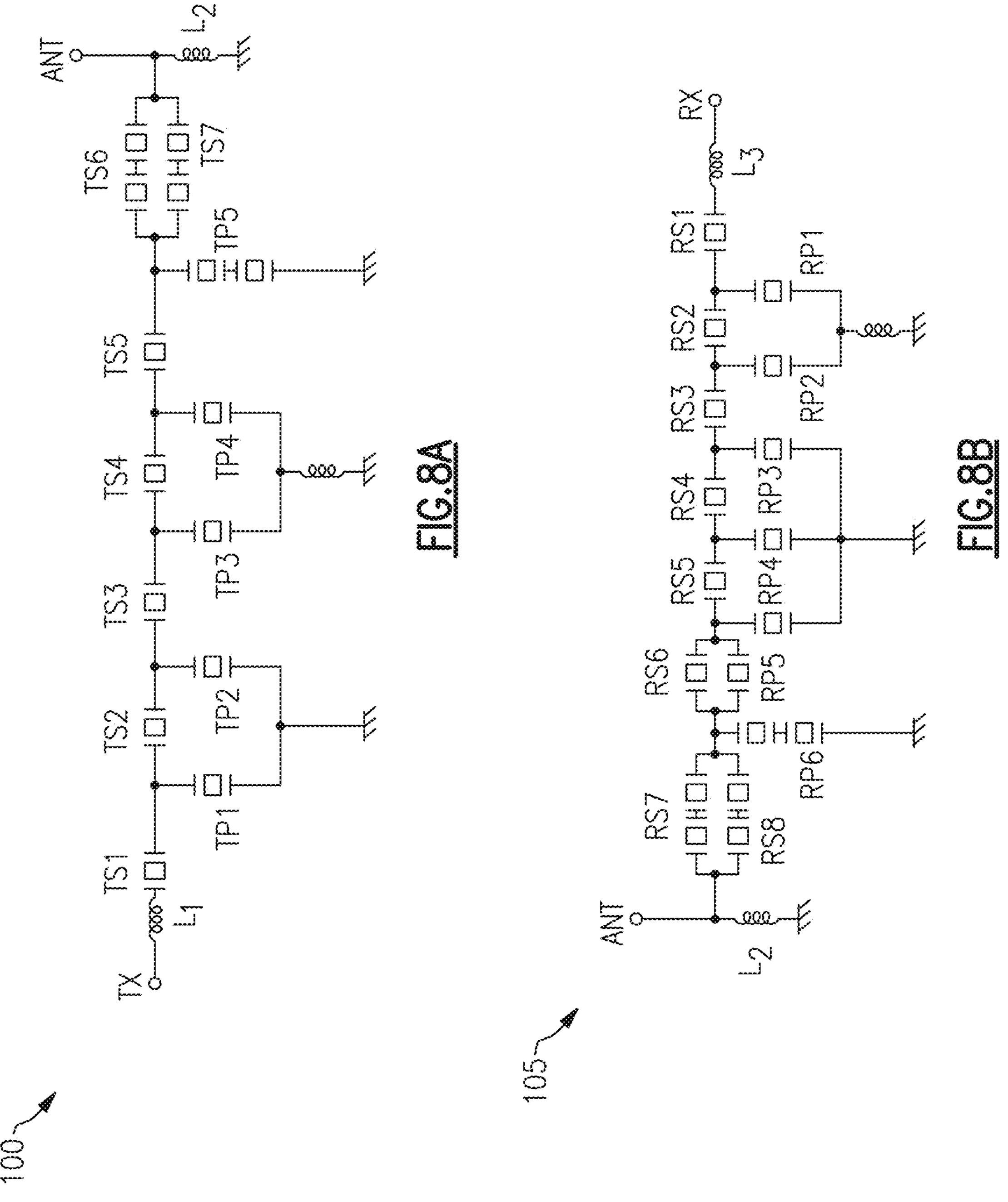
FIG. 8A is a schematic diagram of a transmit filter that includes a surface acoustic wave resonator according to an embodiment.
FIG. 8B is a schematic diagram of a receive filter that includes a surface acoustic wave resonator according to an embodiment.

FIG. 8A is a schematic diagram of an example transmit filter 100 that includes surface acoustic wave resonators according to an embodiment. The transmit filter 100 can be a band pass filter. The illustrated transmit filter 100 is arranged to filter a radio frequency signal received at a transmit port TX and provide a filtered output signal to an antenna port ANT. Some or all of the SAW resonators TS1 to TS7 and/or TP1 to TP5 can be a SAW resonator in accordance with any suitable principles and advantages disclosed herein. For instance, one or more of the SAW resonators of the transmit filter 100 can be a surface acoustic wave resonator 1 of FIG. 1. Alternatively or additionally, one or more of the SAW resonators of the transmit filter 100 can be any surface acoustic wave resonator disclosed herein. Any suitable number of series SAW resonators and shunt SAW resonators can be included in a transmit filter 100.

FIG. 8B is a schematic diagram of a receive filter 105 that includes surface acoustic wave resonators according to an embodiment. The receive filter 105 can be a band pass filter. The illustrated receive filter 105 is arranged to filter a radio frequency signal received at an antenna port ANT and provide a filtered output signal to a receive port RX. Some or all of the SAW resonators RS1 to RS8 and/or RP1 to RP6 can be SAW resonators in accordance with any suitable principles and advantages disclosed herein. For instance, one or more of the SAW resonators of the receive filter 105 can be a surface acoustic wave resonator 1 of FIG. 1. Alternatively or additionally, one or more of the SAW resonators of the receive filter 105 can be any surface acoustic wave resonator disclosed herein. Any suitable number of series SAW resonators and shunt SAW resonators can be included in a receive filter 105.

Although FIGS. 8A and 8B illustrate example ladder filter topologies, any suitable filter topology can include a SAW resonator in accordance with any suitable principles and advantages disclosed herein. Example filter topologies, include ladder topology, a lattice topology, a hybrid ladder and lattice topology, a multi-mode SAW filter, a multi-mode SAW filter combined with one or more other SAW resonators, and the like.

Figure 9:
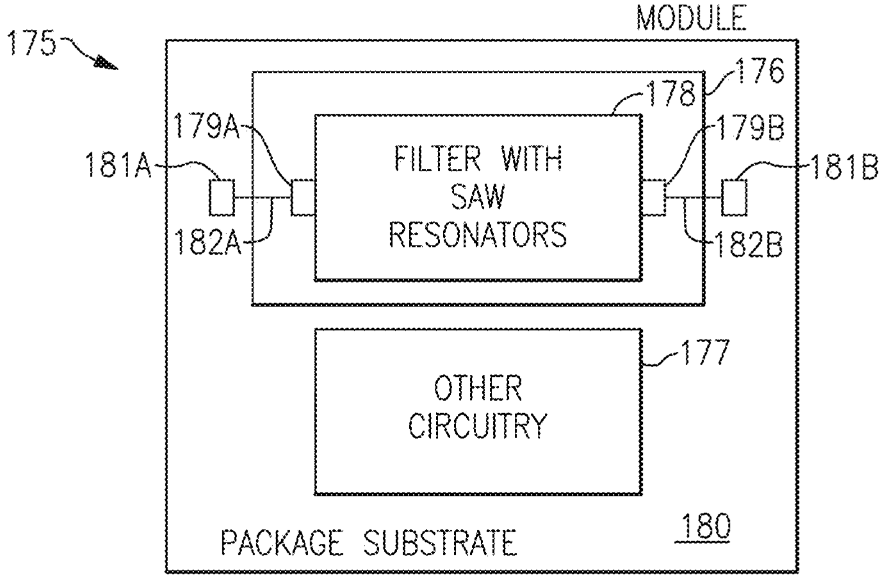
FIG. 9 is a schematic diagram of a radio frequency module that includes a surface acoustic wave resonator according to an embodiment.

FIG. 9 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators disclosed herein. The SAW component 176 can include a SAW die that includes SAW resonators.

The SAW component 176 shown in FIG. 9 includes a filter 178 and terminals 179A and 179B. The filter 178 includes SAW resonators. One or more of the SAW resonators can be implemented in accordance with any suitable principles and advantages of the surface acoustic wave resonator 1 of FIG. 1 and/or any surface acoustic wave resonator disclosed herein. The terminals 179A and 178B can serve, for example, as an input contact and an output contact. The SAW component 176 and the other circuitry 177 are on a common packaging substrate 180 in FIG. 9. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 10:
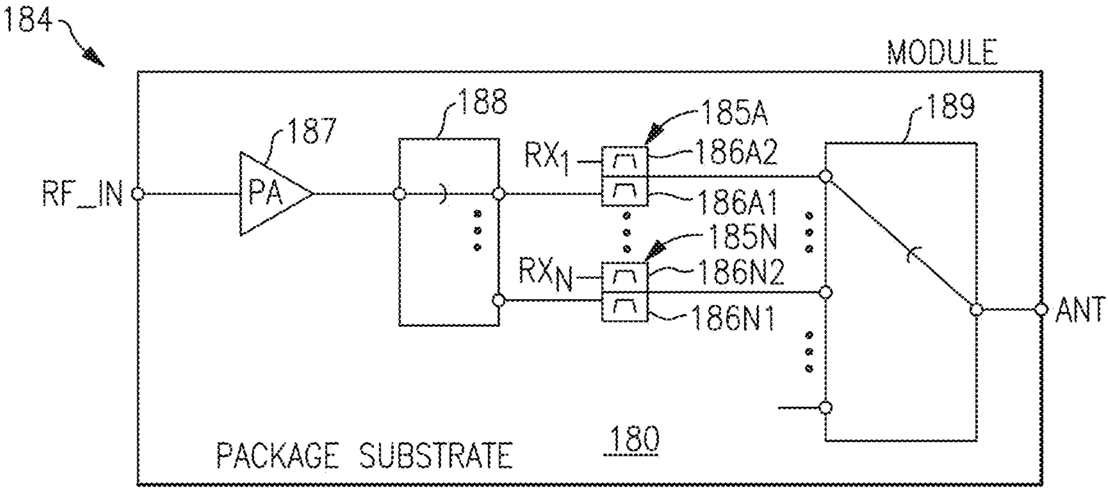
FIG. 10 is a schematic diagram of a radio frequency module that includes filters with surface acoustic wave resonators according to an embodiment.

FIG. 10 is a schematic diagram of a radio frequency module 184 that includes a surface acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators in accordance with any suitable principles and advantages disclosed herein. Similarly, one or more of the receive filters 186A2 to 186N2 can include one or more SAW resonators in accordance with any suitable principles and advantages disclosed herein. Although FIG. 10 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 11:
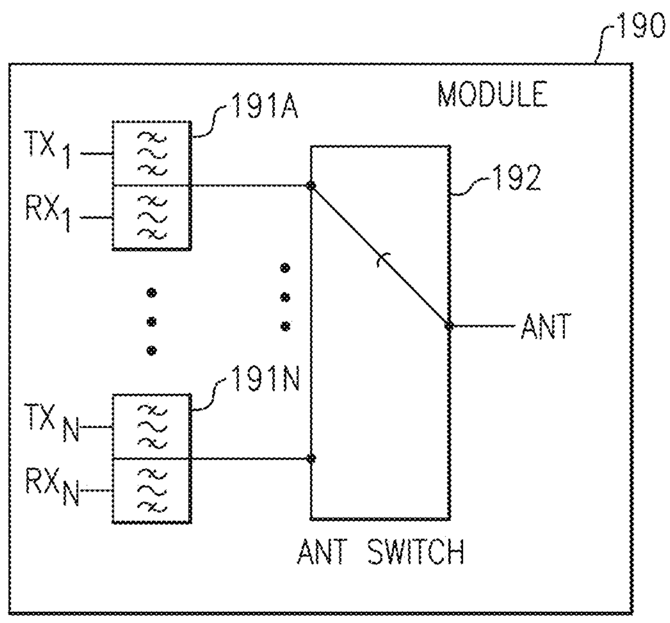
FIG. 11 is a schematic block diagram of a module that includes an antenna switch and duplexers that include a surface acoustic wave resonator according to an embodiment.

FIG. 11 is a schematic block diagram of a module 190 that includes duplexers 191A to 191N and an antenna switch 192. One or more filters of the duplexers 191A to 191N can include any suitable number of surface acoustic wave resonators in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 12A:
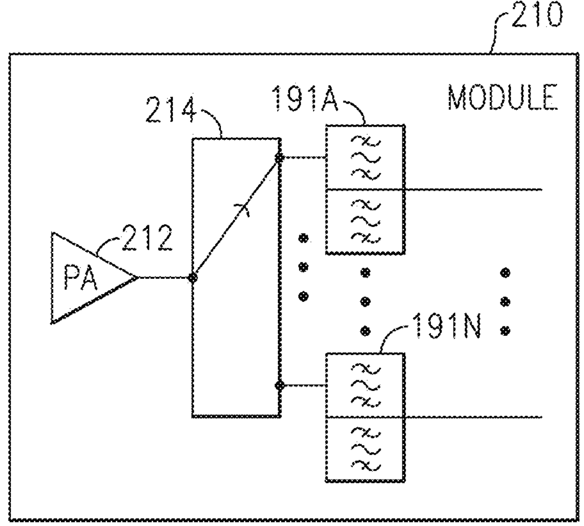
FIG. 12A is a schematic block diagram of a module that includes a power amplifier, a radio frequency switch, and duplexers that include a surface acoustic wave resonator according to an embodiment.

FIG. 12A is a schematic block diagram of a module 210 that includes a power amplifier 212, a radio frequency switch 214, and duplexers 191A to 191N in accordance with one or more embodiments. The power amplifier 212 can amplify a radio frequency signal. The radio frequency switch 214 can be a multi-throw radio frequency switch. The radio frequency switch 214 can electrically couple an output of the power amplifier 212 to a selected transmit filter of the duplexers 191A to 191N. One or more filters of the duplexers 191A to 191N can include any suitable number of surface acoustic wave resonators in accordance with any suitable principles and advantages discussed herein. Any suitable number of duplexers 191A to 191N can be implemented.

Figure 12B:
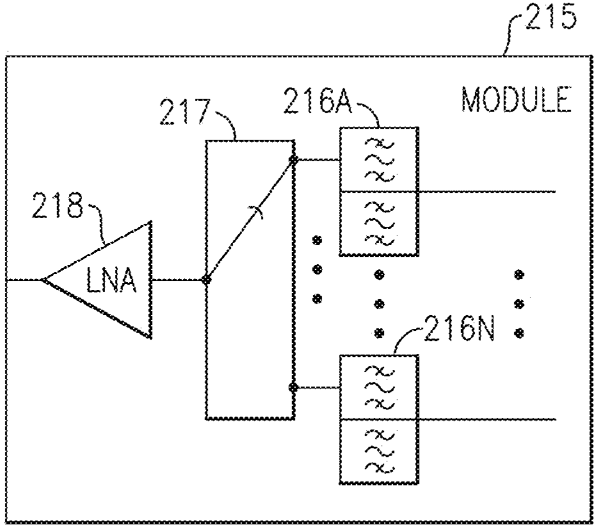
FIG. 12B is a schematic block diagram of a module that includes filters, a radio frequency switch, and a low noise amplifier according to an embodiment.

FIG. 12B is a schematic block diagram of a module 215 that includes filters 216A to 216N, a radio frequency switch 217, and a low noise amplifier 218 according to an embodiment. One or more filters of the filters 216A to 216N can include any suitable number of acoustic wave resonators in accordance with any suitable principles and advantages disclosed herein. Any suitable number of filters 216A to 216N can be implemented. The illustrated filters 216A to 216N are receive filters. In some embodiments (not illustrated), one or more of the filters 216A to 216N can be included in a multiplexer that also includes a transmit filter. The radio frequency switch 217 can be a multi-throw radio frequency switch. The radio frequency switch 217 can electrically couple an output of a selected filter of filters 216A to 216N to the low noise amplifier 218. In some embodiments (not illustrated), a plurality of low noise amplifiers can be implemented. The module 215 can include diversity receive features in certain applications.

Figure 13A:
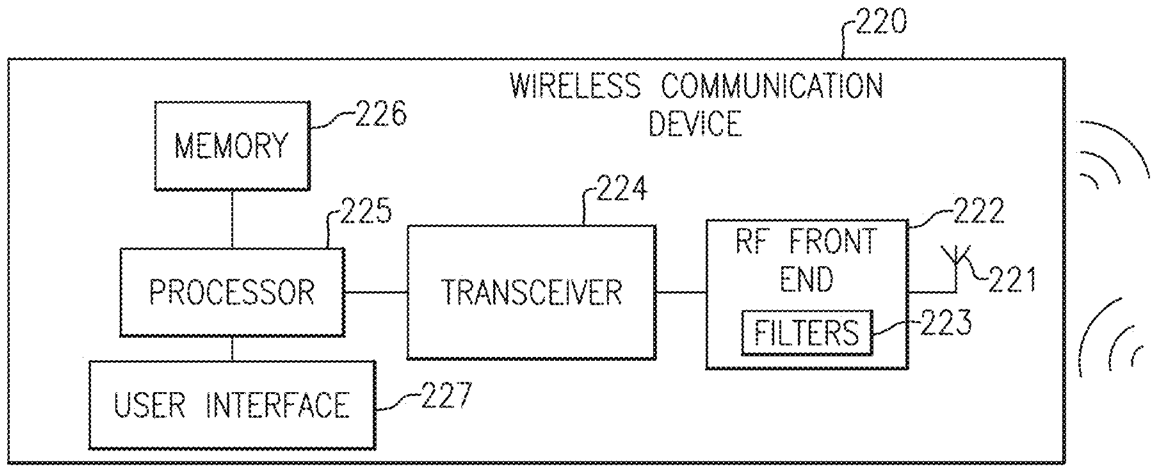
FIG. 13A is a schematic block diagram of a wireless communication device that includes a filter with a surface acoustic wave resonator in accordance with one or more embodiments.

FIG. 13A is a schematic diagram of a wireless communication device 220 that includes filters 223 in a radio frequency front end 222 according to an embodiment. The filters 223 can include one or more SAW resonators in accordance with any suitable principles and advantages discussed herein. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit/receive RF signals provided by the RF front end 222. Such RF signals can include carrier aggregation signals. Although not illustrated, the wireless communication device 220 can include a microphone and a speaker in certain applications.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards. The filters 223 can include SAW resonators of a SAW component that includes any suitable combination of features discussed with reference to any embodiments discussed above.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 13B:
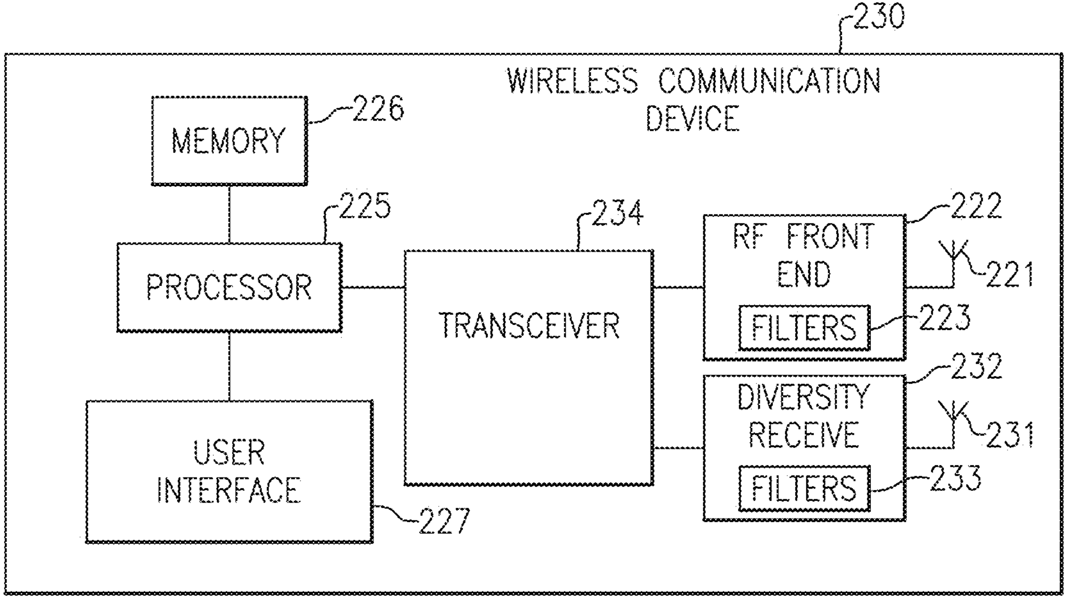
FIG. 13B is a schematic block diagram of another wireless communication device that includes a filter with a surface acoustic wave resonator in accordance with one or more embodiments.

FIG. 13B is a schematic diagram of a wireless communication device 230 that includes filters 223 in a radio frequency front end 222 and a second filter 233 in a diversity receive module 232. The wireless communication device 230 is like the wireless communication device 200 of FIG. 13A, except that the wireless communication device 230 also includes diversity receive features. As illustrated in FIG. 13B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators that include an IDT electrode, such as Lamb wave resonators and/or boundary wave resonators. For example, any suitable combination of features of the tilted and rotated IDT electrodes disclosed herein can be applied to a Lamb wave resonator and/or a boundary wave resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 KHz to 300 GHz, such as in a frequency range from about 450 MHz to 8.5 GHZ. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words “comprise,” “comprising,” “include,” “including” and the like are to be construed in an inclusive sense, as opposed to an exclusive or exhaustive sense; that is to say, in the sense of “including, but not limited to.” The word “coupled”, as generally used herein, refers to two or more elements that may be either directly connected, or connected by way of one or more intermediate elements. Likewise, the word “connected”, as generally used herein, refers to two or more elements that may be either directly connected, or connected by way of one or more intermediate elements. As used herein, the term “approximately” intends that the modified characteristic need not be absolute, but is close enough so as to achieve the advantages of the characteristic. Additionally, the words “herein,” “above,” “below,” and words of similar import, when used in this application, shall refer to this application as a whole and not to any particular portions of this application. Where the context permits, words in the above Detailed Description using the singular or plural number may also include the plural or singular number respectively. The word “or” in reference to a list of two or more items, that word covers all of the following interpretations of the word: any of the items in the list, all of the items in the list, and any combination of the items in the list.

Moreover, conditional language used herein, such as, among others, “can,” “could,” “might,” “may,” “e.g.,” “for example,” “such as” and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure.

Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave device comprising:

a single crystal support layer;

an intermediate single crystal layer over the single crystal support layer, the intermediate single crystal layer having a thickness greater than 5λ, λ being a wavelength of the surface acoustic wave device;

a lithium based piezoelectric layer over the intermediate single crystal layer;

a thermal conductivity of the single crystal support layer is greater than a thermal conductivity of the intermediate single crystal layer, and the thermal conductivity of the single crystal support layer is greater than a thermal conductivity of the lithium based piezoelectric layer; and an interdigital transducer electrode over the lithium based piezoelectric layer, the surface acoustic wave device configured to generate a surface acoustic wave.

2. The surface acoustic wave device of claim 1 wherein the single crystal support layer is a silicon layer or an aluminum nitride layer.

3. The surface acoustic wave device of claim 1 wherein the single crystal support layer has a thickness that is greater than a combined thickness of the intermediate single crystal layer and the lithium based piezoelectric layer.

4. The surface acoustic wave device of claim 1 wherein the intermediate single crystal layer is a quartz layer, and the quartz layer has a first Euler angle φ in a range from 40° to 50°, a second Euler angle θ in a range from 85° to 95°, and a third Euler angle ψ in a range from 85° to 95°.

5. The surface acoustic wave device of claim 1 wherein the intermediate single crystal layer is a quartz layer, and the quartz layer has a first Euler angle φ in a range from −5° to 5°, a second Euler angle θ in a range from 120° to 170°, and a third Euler angle ψ in a range from −5° to 5° or 85° to 95°.

6. The surface acoustic wave device of claim 1 wherein the intermediate single crystal layer has a thickness in a range from 5λ to 20λ.

7. The surface acoustic wave device of claim 1 wherein the lithium based piezoelectric layer is a lithium tantalate layer or a lithium niobate layer, the lithium tantalate layer has a first Euler angle φ in a range from −5° to 5°, a second Euler angle θ in a range from 100° to 150°, and a third Euler angle ψ in a range from −5° to 5°, and the lithium niobate layer has a first Euler angle φ in a range from −5° to 5°, a second Euler angle θ in a range from 100° to 150°, and a third Euler angle ψ in a range from −5° to 5°.

8. The surface acoustic wave device of claim 1 wherein the lithium based piezoelectric layer has a thickness in a range from 0.1λ to 2λ.

9. The surface acoustic wave device of claim 1 wherein the thermal conductivity of the single crystal support layer is at least double the thermal conductivity of the intermediate single crystal layer.

10. A surface acoustic wave device comprising:

a support layer;

a quartz layer over the support layer, the quartz layer with a first Euler angle φ in a range from 40° to 50°, a second Euler angle θ in a range from 85° to 95°, and a third Euler angle ψ in a range of 85° to 95°;

a lithium based piezoelectric layer over the quartz layer, the lithium based piezoelectric layer having a lower thermal conductivity than the support layer; and an interdigital transducer electrode over the lithium based piezoelectric layer, the surface acoustic wave device configured to generate a surface acoustic wave.

11. The surface acoustic wave device of claim 10 wherein the support layer is a silicon layer or an aluminum nitride layer.

12. The surface acoustic wave device of claim 10 wherein the support layer has a thickness greater than a combined thickness of the quartz layer and the lithium based piezoelectric layer.

13. The surface acoustic wave device of claim 10 wherein the quartz layer has a thickness in a range from 5λ to 20λ, λ is a wavelength of the surface acoustic wave.

14. The surface acoustic wave device of claim 10 wherein the lithium based piezoelectric layer has a thickness in a range from 0.1λ to 2λ.

15. The surface acoustic wave device of claim 10 further comprising a silicon dioxide layer between the quartz layer and the lithium based piezoelectric layer.

16. The surface acoustic wave device of claim 10 further comprising a first silicon dioxide layer between the support layer and the quartz layer, and a second silicon dioxide layer between the quartz layer and the lithium based piezoelectric layer.

17. An acoustic wave filter for filtering a radio frequency signal, the acoustic wave filter comprising the surface acoustic wave device of claim 10.

18. A surface acoustic wave device comprising:

a z-propagation quartz layer having a first Euler angle φ in a range from 40° to 50°, a second Euler angle θ in a range from 85° to 95°, and a third Euler angle ψ in a range of 85° to 95°;

a support layer below the z-propagation quartz layer, the support layer having a first thermal conductivity that is higher than a second thermal conductivity of the z-propagation quartz layer;

a lithium based piezoelectric layer over the z-propagation quartz layer, the lithium based piezoelectric layer having a third thermal conductivity that is less than the first thermal conductivity of the support layer; and an interdigital transducer electrode over the lithium based piezoelectric layer, the surface acoustic wave device configured to generate a surface acoustic wave.

19. The surface acoustic wave device of claim 18 wherein the support layer is a spinel support layer or a silicon support layer.

20. The surface acoustic wave device of claim 18 wherein the first thermal conductivity of the support layer is at least double the second thermal conductivity of the z-propagation quartz layer.

* * * * *